United States Patent
Vashchenko et al.

(10) Patent No.: US 6,970,335 B1
(45) Date of Patent: Nov. 29, 2005

(54) LVTSCR ESD PROTECTION CLAMP WITH DYNAMICALLY CONTROLLED BLOCKING JUNCTION

(75) Inventors: Vladislav Vashchenko, Palo Alto, CA (US); Ann Concannon, Palo Alto, CA (US); Peter J Hopper, San Jose, CA (US); Marcel ter Beek, Pleasanton, CA (US)

(73) Assignee: National Semiconductor Corporation, Santa Clara, CA (US)

(*) Notice: Subject to any disclaimer, the term of this patent is extended or adjusted under 35 U.S.C. 154(b) by 131 days.

(21) Appl. No.: 10/626,105

(22) Filed: Jul. 23, 2003

(51) Int. Cl.[7] .............................. H02H 9/00
(52) U.S. Cl. ............................ 361/56; 257/355
(58) Field of Search .............. 361/56, 91.1, 91.5, 361/91.8, 111; 257/175, 355

(56) References Cited

U.S. PATENT DOCUMENTS

| | | | | |
|---|---|---|---|---|
| 5,528,188 A | * | 6/1996 | Au et al. ............... | 327/310 |
| 6,055,143 A | * | 4/2000 | Yu ........................ | 361/56 |
| 6,433,979 B1 | * | 8/2002 | Yu ........................ | 361/56 |
| 6,465,848 B2 | * | 10/2002 | Ker et al. ............. | 257/355 |
| 6,720,624 B1 | * | 4/2004 | Vashchenko et al. .. | 257/360 |
| 6,822,294 B1 | * | 11/2004 | Vashchenko et al. .. | 257/355 |

* cited by examiner

Primary Examiner—Ronald Leja
(74) Attorney, Agent, or Firm—Jurgen Vollrath

(57) ABSTRACT

In an SCR-based ESD protection clamp, the voltage overshoot during an ESD event is reduced by separately controlling the voltage pulse to the drain and emitter contacts of the SCR. The voltage pulse to the drain is preferably delayed using a delay circuit such as an RC circuit. This allows double conductivity modulation to be achieved with lower voltage overshoot.

15 Claims, 3 Drawing Sheets

LVTSCR ESD PROTECTION CLAMP WITH DYNAMICALLY CONTROLLED BLOCKING JUNCTION

FIELD OF THE INVENTION

The invention relates to a new semiconductor structure and sub-circuit design for an ESD protection clamp for CMOS, BiCMOS, BCD integrated circuits. In particular, it relates to a silicon controlled rectifier (SCR) such as a low voltage silicon controlled rectifier (LVTSCR) ESD protection clamp.

BACKGROUND OF THE INVENTION

Due to double injection conductivity modulation LVTSCRs handle approximately 10 times the pulse power after snapback compared to Grounded Gate NMOS (GGNMOS) or NPN BJT structures of similar size. One of their main benefits is the ability to support high current densities which allows them to be made smaller than GGNMOS or BJTs with similar current handling capabilities. This also has the effect of providing lower parasitic capacitance. This makes LVTSCRs promising devices for IC protection.

However, they also suffer from drawbacks such as low holding voltage which makes them susceptible to latch-up. They also display a high resistance between the floating drain and drain contact, resulting in low saturation current under normal operation. Thus they have limited application in self-protecting applications. Also, they require a high triggering current. Further, LVTSCRs provide high voltage overshoot. This is due to an internal NMOS and NPN BJT structure and high triggering current. Some of these characteristics are better understood when considering a typical LVTSCR structure. FIG. 1 shows a dual gate LVTSCR, but the workings of the dual gate LVTSCR discussed below are applicable also to single gate structures. The following discussion of an LVTSCR also serves to define the terminology used for certain regions referred to in describing the invention in the detailed description of the invention section. The LVTSCR 100 includes a p-well 102, a p+ region 104 acting as p-well contact region (also referred to as the bulk 104), source contact region 106, a first polygate 108, a second polygate 110, a floating drain region 112, a p+ emitter contact region 114, a n+ drain contact region 116 and corresponding n-well isolation 118 of the emitter junction. The n+ floating drain 112 and p-well 102 define a blocking junction under the dual polygate 108, 110. FIG. 1 also shows a contact 130 to the bulk 104 and source contact region 106. It also shows an emitter contact 132 to the emitter contact region 114, and a drain contact 134 to the drain contact region 116.

Triggering of the structure 100 is dictated by the breakdown voltage. The first stage involves avalanche breakdown of the blocking junction. When the voltage is sufficiently high for impact ionization to occur, the internal NPN BJT (defined by n+ source contact region 106, p-well 102, and n-well 118) triggers causing forward injection of carriers into the n-well 118. This forward biases the junction between the p+ emitter contact region 114 and the n-well 118, to switch on the PNP BJT defined by p+ emitter contact region 114, n-well 118 and p-well 102, which in turn, injects positive charge carriers into the p-well. These are largely swept across to the n+ source contact region 106. The downside with this structure is that there is limited ability to control the triggering. While the gate voltage can be controlled to achieve some effect on triggering, this provides very limited control over the triggering of the structure. As a result Merrill clamps are often used. Merrill clamps, however, are highly space consuming.

SUMMARY OF THE INVENTION

The invention defines a SCR or LVTSCR with dynamically controlled blocking junction. The invention also includes a sub-circuit and method for dynamically controlling the blocking junction. For ease of use, the term SCR will be used for both SCRs generally and LVTSCRs, and although the detailed description specifically shows LVTSCRs, it is to be understood that SCRs could be used instead of the LVTSCRS.

According to the invention there is provided a SCR-based protection clamp for protecting a node of a circuit against ESD events, which includes a SCR with separately connected drain contact and emitter contact in which the drain and emitter contacts are connected to the node but the drain contact is connected to the node through a triggering control circuit. The triggering control circuit may include a delay circuit to delay a voltage pulse to the drain contact. The delay circuit may include an RC circuit, or an RC circuit and a dual inverter to present a lower load to the RC circuit.

Further, according to the invention, there is provided a method of controlling the triggering of a SCR that includes an anode, which includes a drain contact and an emitter contact, and a cathode, comprising controlling the respective times at which a voltage pulse applied across the anode and cathode is applied to the drain and emitter contacts. This may include delaying the voltage pulse to the drain contact using a delay circuit (e.g. by means of an RC circuit) relative to the emitter contact. The method may include providing a high input impedance to the SCR as seen by the RC circuit. This may include providing a double inverter between the RC circuit and the SCR.

DETAILED DESCRIPTION OF THE INVENTION

Figure 2:
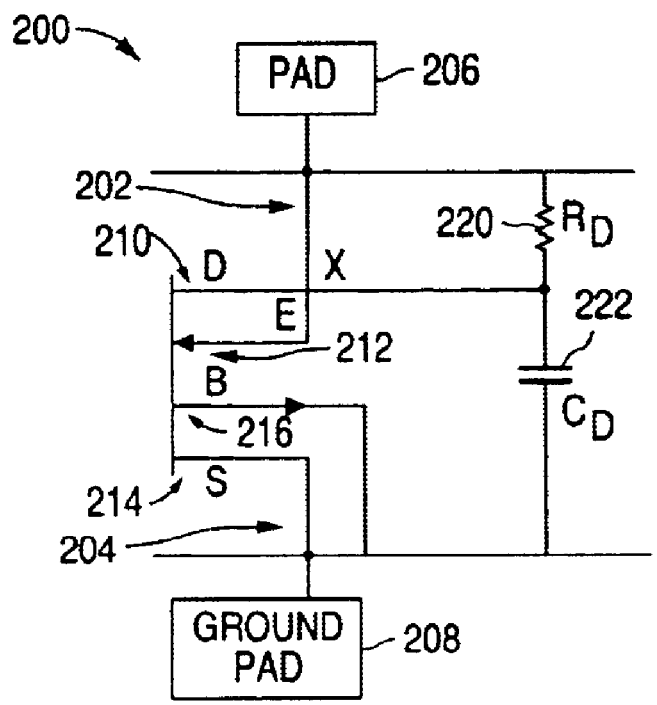
FIG. 2 is one embodiment of a LYTSCR-based circuit of the invention.

FIG. 2 shows one embodiment of the invention in which the LVTSCR 200 includes an anode 202 and a cathode 204. The anode 202 is connected to a pad 206 which is connected to VDD in this embodiment, and the cathode 204 is connected to ground. Both the drain contact 210 and emitter contact 212 of the LVTSCR 200 are connected to the pad 206 and thereby define the anode of the structure. The source contact 214 and bulk contact 216 are connected to ground. As can be seen in FIG. 2, the drain contact is not connected directly to the pad 206 but is connected to an RC circuit, comprising a resistor 220 and a capacitor 222. This has the effect of delaying a voltage pulse applied to the pad.

Therefore, a voltage pulse, such as an ESD pulse will first appear at the emitter through the emitter contact 212 before appearing at the drain through the drain contact 210, since the RC circuit will delay the voltage pulse to the drain. Thus, initially, before the capacitor 222 charges up, the drain contact or drain electrode potential is held close to ground. As a result the LVTSCR emitter is opened and injection starts earlier. If the capacitor 222 is big enough, the injection of carriers from the emitter is large enough to bring the LVTSCR into double injection conductivity mode, thereby reducing voltage overshoot.

Figure 4:
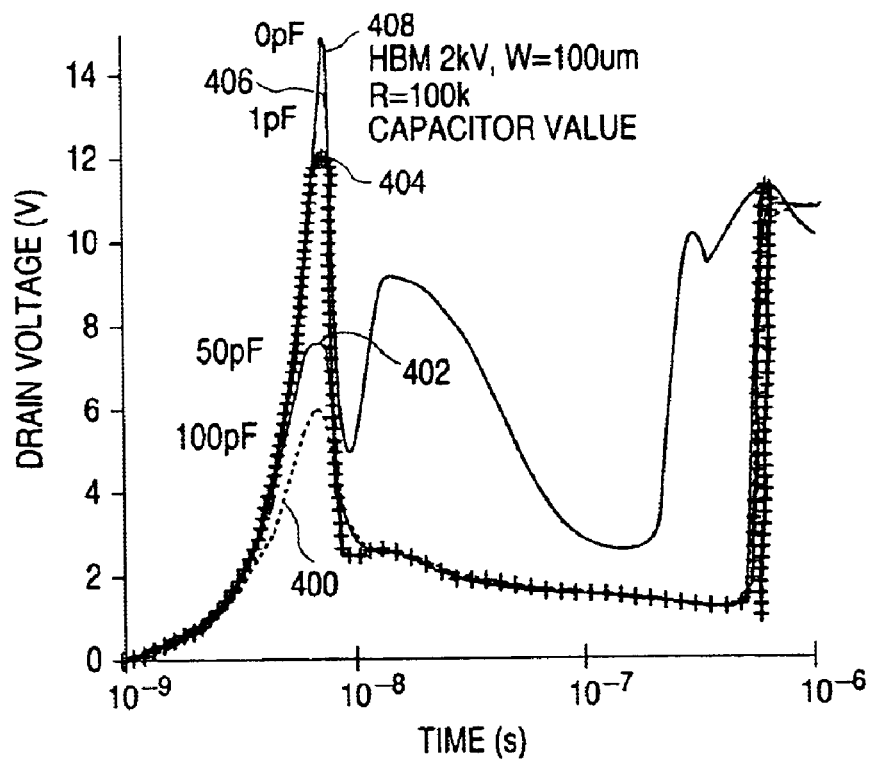
FIG. 4 shows a set of drain voltage versus time graphs for different capacitor values of the embodiment of FIG. 2.
Figure 5:
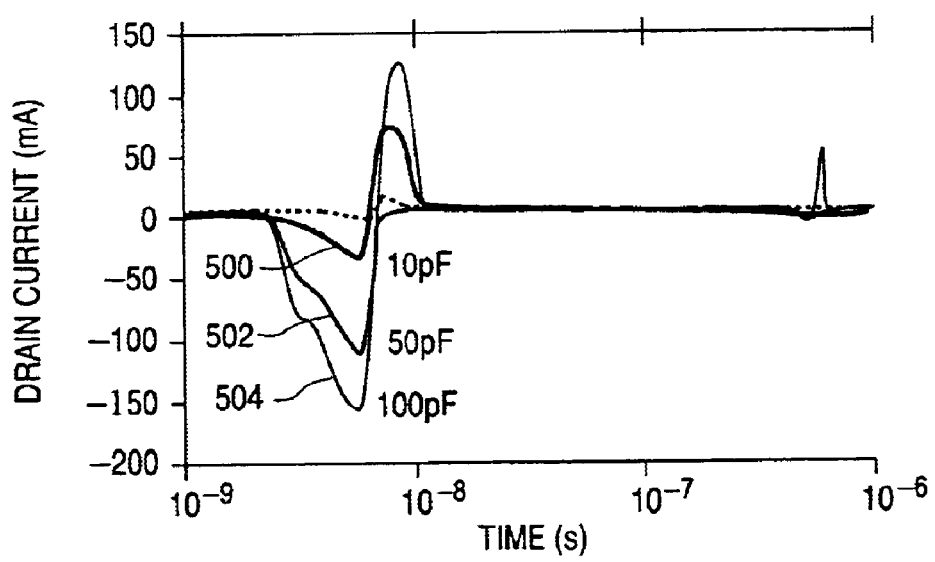
FIG. 5 is a set of drain current versus time graphs for different capacitor values of the embodiment of FIG. 2.

This can be seen in FIGS. 4 and 5. For a 100 pF capacitor, the voltage peak is only about 6 V (curve 400) compared to about 15 V without a capacitor (curve 408). As the capacitor is increased from 1 pF to 10 pF to 50 pF to 100 pF (curves 406, 404, 402, 400, respectively), the voltage overshoot can clearly be seen to decrease. Corresponding current curves for capacitors of 10 pF, 50 pF, 100 pF can be seen in FIG. 5 (curves 500, 502, 504, respectively).

Figure 3:
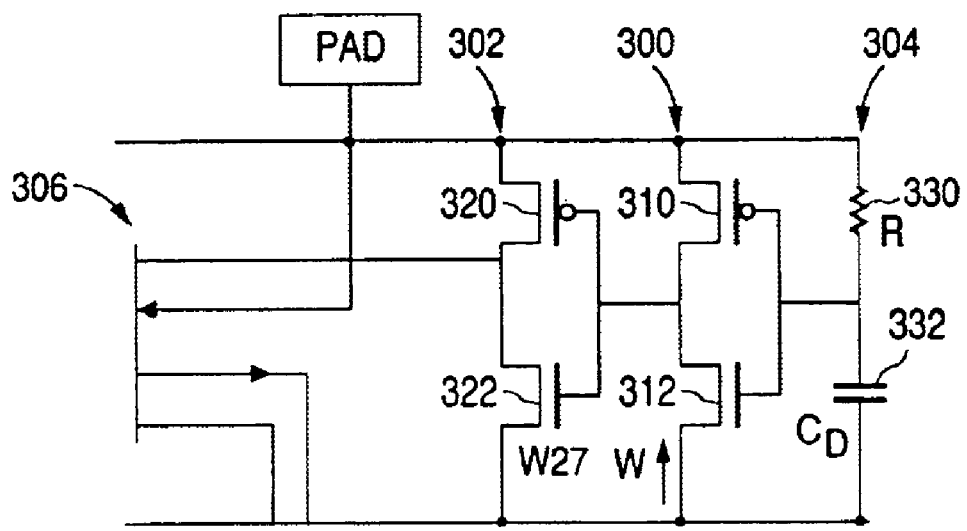
FIG. 3 is another embodiment of a LVTSCR-based circuit of the invention.

In order to reduce the size of the capacitor that is needed to achieve the desired drop in voltage overshoot, another embodiment includes a double inverter, thereby presenting the RC circuit with a high input impedance. This is shown in FIG. 3 where a first inverter 300 and a second inverter 302 are provided between the RC circuit 304 and the LVTSCR 306. The first inverter 300 includes a PMOS transistor 310 and a NMOS transistor 312, and the second inverter 302 includes a PMOS transistor 320 and a NMOS transistor 322. The RC circuit 304 includes a resistor 330 and a capacitor 332. Typically the second inverter 302 is larger than the first inverter 300 and can have a contact width of 100 $\mu$m to 1000 $\mu$m compared to the first inverter which may have a contact width of 1 $\mu$m to 10 $\mu$m. While the embodiment of Figure three involved the use of two inverters, it will be appreciated that any even number of inverters could be used. In yet another embodiment, the positions of the resistor and capacitor were reversed to have the capacitor at the top. In such an embodiment the drain will be initially held high and then be pulled down as the capacitor charges up. Thus, to achieve the delay of the voltage pulse to the drain contact, any odd number, e.g., 1 inverter, was used with the RC circuit.

It was found that the use of a double inverter as in FIG. 3 provided similar voltage overshoot with a small RC circuit of 1 pF capacitor and 100 k resistor as was achieved using a large 100 pF capacitor without a double inverter.

In both embodiments, however, a clear benefit is achieved by separately controlling the drain and emitter to delay the voltage pulse to the drain. Under normal operation the capacitor will be fully charged. Thus the potential on the drain electrode will be equal to the emitter potential. This ensures low leakage operation.

Figure 1:
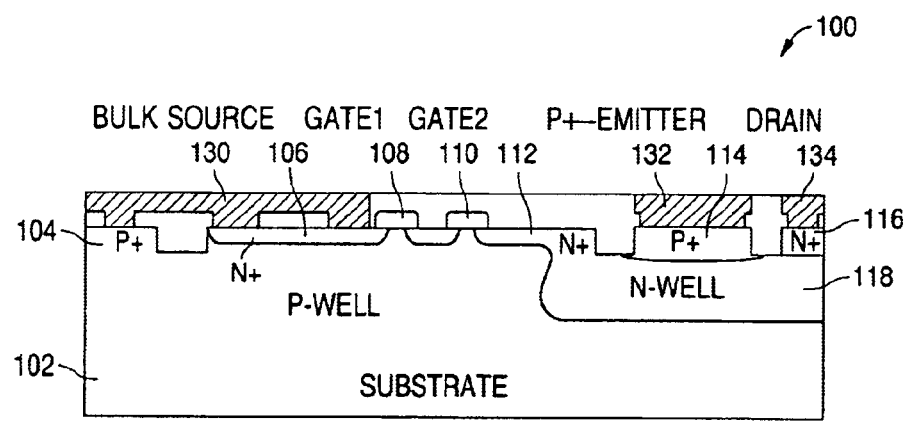
FIG. 1 is a sectional view of a typical dual gate LVTSCR known in the art.
Figure 6:
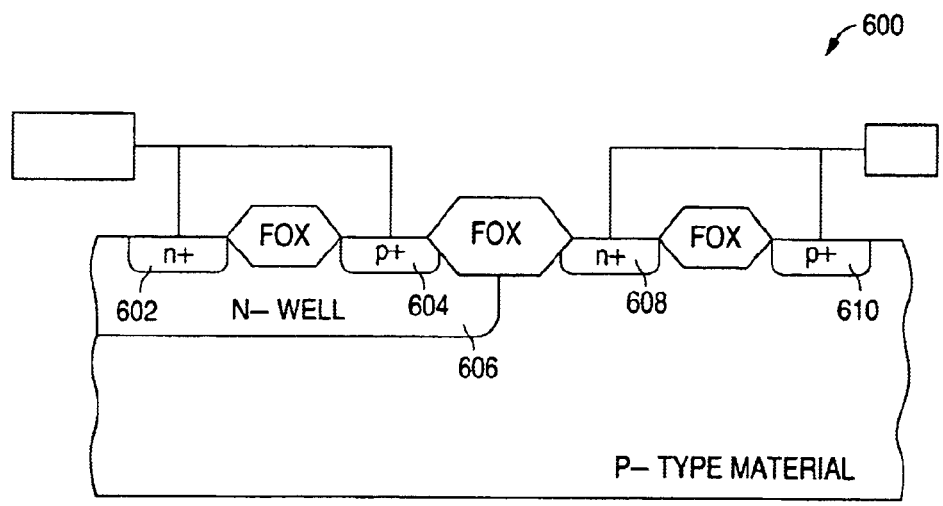
FIG. 6 is a sectional view of a typical SCR known in the art.

While the embodiments described above dealt specifically with LVTSCRs, the invention also applies to the use of SCRs in general. For ease of claiming, the term SCR will be used generally to refer to any kind of SCR, including LVTSCRs. For completeness, FIG. 6 shows an SCR 600 with its drain 602 and emitter 604 formed in n-well 606, source 608, and bulk 610. It will also be appreciated that the invention can be implemented using different delay circuits other than RC circuits. In fact the invention could make use of any timer circuit to control the voltage pulse to the drain contact. For example, the timer circuit could comprise a mixture of NMOS and BJT devices. It could also be a more complex circuit with amplification that delivers a dynamic low potential on the LVTSCR anode n-region (drain contact region) to create a temporary condition for biasing the junction in a forward direction during the ESD transient pulse (~10–100 ns) and then bring the region potential to Vdd

What is claimed is:

1. A SCR-based protection clamp for protecting a node of a circuit against ESD events, comprising
    a SCR with separately connected drain contact and emitter contact in which the drain and emitter contacts are connected to the node but the drain contact is connected to the node through a triggering control circuit.

2. A clamp of claim 1, wherein the triggering control circuit includes a delay circuit to delay a voltage pulse to the drain contact.

3. A clamp of claim 2, wherein the delay circuit includes an RC circuit.

4. A clamp of claim 3, further including at least one inverter between the RC circuit and the SCR.

5. A clamp of claim 4, wherein the at least one inverter comprises an even number of inverters, and the RC circuit includes a resistor connected to the node and a capacitor connected to ground.

6. A clamp of claim 4, wherein the at least one inverter comprises an odd number of inverters, and the RC circuit includes a capacitor connected to the node and a resistor connected to ground.

7. A method of controlling the triggering of a SCR that includes a cathode and an anode, the anode being defined by a drain contact and an emitter contact, comprising
    controlling the respective times at which a voltage pulse applied across the anode and cathode is applied to the drain and emitter contacts.

8. A method of claim 1, wherein the controlling of the respective times at which the voltage pulse is applied to the drain and emitter contacts, includes delaying the voltage pulse to the drain contact using a delay circuit.

9. A method of claim 8, wherein the voltage pulse is delayed relative to the emitter contact.

10. A method of claim 9, wherein the voltage pulse is delayed by means of an RC circuit.

11. A method of claim 10, further comprising providing a high input impedance to the SCR as seen by the RC circuit.

12. A method of claim 11, wherein the providing of a high input impedance includes providing at least one inverter between the RC circuit and the SCR.

13. A method of claim 12, wherein providing at least one inverter includes providing an even number of inverters.

14. A method of claim 13, wherein providing the even number of inverters comprises providing two inverters.

15. A method of claim 12, wherein providing at least one inverter includes providing an odd number of inverters.

* * * * *